(12) United States Patent
Kaihatsu

(10) Patent No.: US 6,768,687 B2
(45) Date of Patent: Jul. 27, 2004

(54) MEMORY ARRAY

(75) Inventor: Minoru Kaihatsu, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/203,610

(22) PCT Filed: Dec. 14, 2000

(86) PCT No.: PCT/JP01/10995
§ 371 (c)(1),
(2), (4) Date: Nov. 14, 2002

(87) PCT Pub. No.: WO02/49036
PCT Pub. Date: Jun. 20, 2002

(65) Prior Publication Data
US 2003/0095446 A1 May 22, 2003

(30) Foreign Application Priority Data
Dec. 15, 2000 (JP) ........................................ 2000-382580

(51) Int. Cl.[7] .............................................. G11C 7/00
(52) U.S. Cl. .................. 365/189.07; 365/149; 365/190; 365/203
(58) Field of Search ........................... 365/189.07, 149, 365/190, 203

(56) References Cited

U.S. PATENT DOCUMENTS 5,377,152 A * 12/1994 Kushiyama et al. ........ 365/210
5,532,963 A * 7/1996 Kushiyama et al. ........ 365/201
6,097,649 A * 8/2000 Chiang et al. .............. 365/203
6,230,292 B1 * 5/2001 Duesman et al. ........... 714/718
6,292,385 B1 * 9/2001 Kim .......................... 365/145

FOREIGN PATENT DOCUMENTS

JP       63-222385       9/1988

* cited by examiner

*Primary Examiner*—Hoai Ho
(74) *Attorney, Agent, or Firm*—Rader, Fishman & Grauer PLLC; Ronald P. Kananen

(57) ABSTRACT

An object of the invention is to obtain a memory array capable of preventing coupling noise from being produced on a cell plate voltage line. A memory array of the invention comprises: first and second dummy word lines (DWL0 and DWL1); a first dummy memory cell (DMC0) connected to a first bit line (BL), the first dummy word line (DWL0) and a common cell plate voltage line (VL); and a second dummy memory cell (DMC1) connected to a second bit line (BLB), the second dummy word line (DWL1) and the voltage line (VL), wherein second dummy data having opposite polarity to polarity of first data are written in the second dummy memory cell (DMC1) so as to write the first data in a first memory cell (MC0), and first dummy data having opposite polarity to polarity of second data are written in the first dummy memory cell (DMC0) so as to write the second data in a second memory cell (MC1).

6 Claims, 6 Drawing Sheets

FIG. 2A WL0
FIG. 2B DWL1
FIG. 2C BL/BLB
FIG. 2D Vcp
FIG. 2E PEQ

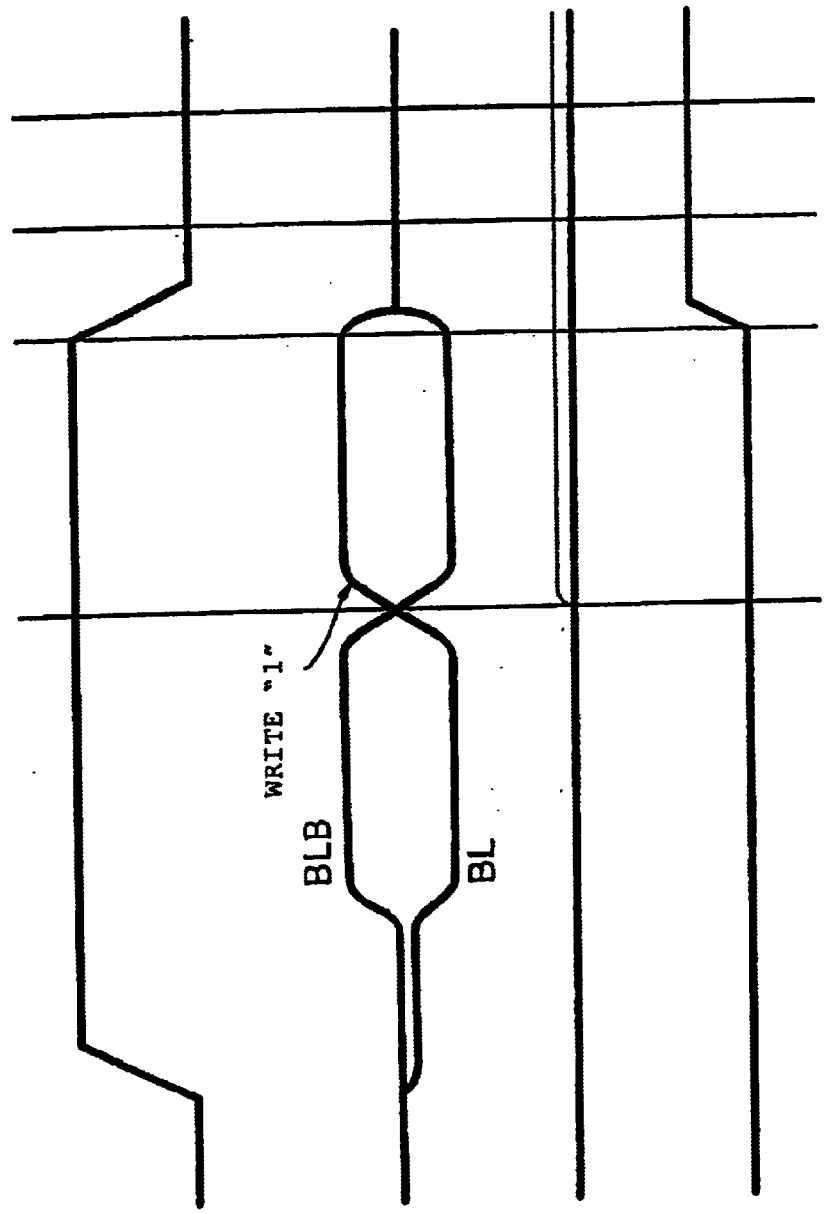
FIG. 6A PRIOR ART WL0
FIG. 6B PRIOR ART BL/BLB
FIG. 6C PRIOR ART Vcp
FIG. 6D PRIOR ART PEQ

MEMORY ARRAY

TECHNICAL FIELD

The invention relates to a memory array.

BACKGROUND ART

A memory array of a DRAM of the prior art will be described below with reference to FIG. 5. MC0, MC1, ..., MC(n−1) and MCn denote memory cells, each of which comprises a switching transistor Q (a MOSFET) and a capacitor C which are connected in series. WL0, WL1, ..., WL2n, and WL(2n+1) denote word lines for activating the memory cells MC0, MC1, ..., MC(n−1), and MCn, respectively. BL and BLB denote a pair of bit lines whose complementary logic voltages are interchanged during the writing of data. VL denotes a cell plate voltage line for applying a cell plate voltage Vcp (=Vcc/2) to the capacitors C of the memory cells MC0, MC1, ..., MC(n−1), and MCn. The cell plate voltage line VL is connected to a cell plate voltage generator circuit (not shown).

Each series circuit comprising the switching transistor Q (the MOSFET) and the capacitor C of each of the memory cells MC0, MC2, ..., and MC(n−1) is connected between the bit line BL and the cell plate voltage line VL. The respective control terminals (i.e., gates) of the switching transistors Q of the memory cells MC0, MC2, ..., and MC(n−1) are connected to the word lines WL0, WL2, ..., and WL2n, respectively. In this case, the capacitors C are connected to the cell plate voltage line VL.

Each series circuit comprising the switching transistor Q and the capacitor C of each of the memory cells MC1, MC3, ..., and MCn is connected between the bit line BLB and the cell plate voltage line VL. The respective control terminals (i.e., gates) of the switching transistors Q of the memory cells MC1, MC3, ..., and MCn are connected to the word lines WL1, WL3, ..., and WL(2n+1), respectively. In this case, the capacitors C are connected to the cell plate voltage line VL.

Furthermore, a sense amplifier SA is connected between the bit lines BL and BLB. An equalizer circuit EQ is also connected between the bit lines BL and BLB. The equalizer circuit EQ comprises MOSFETs Q1, Q2 and Q3. A bit line precharge voltage Vpr (=Vcc/2) is applied to the respective drains of the MOSFETs Q1 and Q2, and the respective sources of the MOSFETs Q1 and Q2 are connected to the bit lines BL and BLB, respectively. A drain and a source of the MOSFET Q3 are connected to the bit lines BL and BLB, respectively. The bit line precharge voltage Vpr is supplied to the bit lines BL and BLB, and a gate signal PEQ for equalizing the bit lines BL and BLB is applied to the respective gates of the MOSFETs Q1, Q2 and Q3.

Actually, a plurality of circuits of FIG. 5 configured as described above are provided, and the word lines WL0, WL1, ..., WL2n, and WL(2n+1), a line to which the bit line precharge voltage Vpr is supplied, and a line to which the gate signal PEQ is supplied are common to the plurality of circuits. The cell plate voltage lines VL of a plurality of circuits are connected to a common cell plate voltage generator circuit.

Next, the operation of the memory array shown in FIG. 5 will be described with reference to FIG. 6. When a voltage of the word line WL0 changes to high level as shown in FIG. 6A and thus the memory cell MC0 is activated or more specifically the MOSFET Q of the memory cell MC0 is turned on, a read operation and a write operation are performed as discussed below. Data "0" stored in the capacitor C of the memory cell MC0 is supplied to the sense amplifier SA through the MOSFET Q and the bit line BL and is then amplified and latched by the sense amplifier SA, and thus a voltage of the bit line BL changes to 0 (V) as shown in FIG. 6B. After that, data "1" is inversely written in the sense amplifier SA and is then amplified and latched by the sense amplifier SA, and thus the voltage of the bit line BL is inverted into Vcc (V) as shown in FIG. 6B. Thus, the data "1" is rewritten in the capacitor C of the memory cell MC0 through the bit line BL and the MOSFET Q of the memory cell MC0.

After the end of rewriting, the voltage of the word line WL0 changes from high level to low level as shown in FIG. 6A, and simultaneously, the gate signal PEQ changes from low level to high level as shown in FIG. 6D. Thus, the MOSFETs Q1 to Q3 constituting the equalizer circuit EQ are switched from the off state to the on state, and thus, both the voltages of the bit lines BL and BLB are equalized and precharged at the bit line precharge voltage Vpr (=Vcc/2) as shown in FIG. 6B.

Incidentally, when the voltage of the word line WL0 changes to high level as shown in FIG. 6A, a voltage of the word line WL1 also changes to high level, and thus the voltage of the bit line BL becomes reverse with respect to the voltage of the bit line BLB as shown in FIG. 6B in a condition in which data is latched by the sense amplifier SA during reading and writing.

As described above, data stored in the activated memory cell is read out, and the data is supplied to the sense amplifier SA through the bit line and is then amplified and latched by the sense amplifier SA. Thereafter, data is inversely written in the sense amplifier SA and is then amplified and latched by the sense amplifier SA. Thus, the high and low voltage amplitudes of the bit lines BL and BLB are interchanged, and then the following or next operation is performed. More specifically, coupling noises are produced on the cell plate voltage line VL through the capacitor of the activated memory cell, and thus the cell plate voltage Vcp of the cell plate voltage line VL changes from Vcp=Vcc/2 to Vcp=(Vcc/2)±dVcp (provided that 0<dVcp<Vcc/2). The cell plate voltage Vcp of the memory array shown in FIG. 5 changes to Vcp=(Vcc/2)+dVcp as shown in FIG. 6C.

In the memory array shown in FIG. 5, a pair of the bit lines BL and BLB is provided, but generally a plurality of pairs of the bit lines BL and BLB are provided. In this case, the cell plate voltage lines VL corresponding to the pairs of the bit lines BL and BLB are connected to a common cell plate voltage generator circuit. The cell plate voltage Vcp changes from Vcp=Vcc/2 to Vcp=(Vcc/2)+dVcp×a−dVcp×b, where "a" denotes the number of bit lines whose voltages change from 0 (V) to Vcc (V) and "b" denotes the number of bit lines whose voltages change from Vcc (V) to 0 (V) provided that a plurality of bit lines are connected to the same word line and are connected to a plurality of memory cells which are which are simultaneously activated.

In view of the foregoing, the invention is intended to provide a memory array capable of preventing coupling noise from being produced on a cell plate voltage line. The memory array includes a plurality of pairs of first and second bit lines whose complementary logic voltages are interchanged during data writing; a plurality of pairs of first and second word lines; a common cell plate voltage line; a first memory cell connected to each first bit line, each first word line and the common cell plate voltage line; a second memory cell connected to each second bit line, each second word line and the common cell plate voltage line; and a sense amplifier connected between the first and second bit lines of each pair, wherein a plurality of the first and second memory cells are arranged in a matrix form.

DISCLOSURE OF THE INVENTION

According to a first aspect of the invention, there is provided a memory array including a plurality of pairs of first and second bit lines whose complementary logic voltages are interchanged during data writing; a plurality of pairs of first and second word lines; a common cell plate voltage line; a first memory cell connected to each first bit line, each first word line and the common cell plate voltage line; a second memory cell connected to each second bit line, each second word line and the common cell plate voltage line; and a sense amplifier connected between the first and second bit lines of each pair, wherein a plurality of the first and second memory cells are arranged in a matrix form, the memory array comprising: first and second dummy word lines; a first dummy memory cell connected to each first bit line, the first dummy word line and the common cell plate voltage line; and a second dummy memory cell connected to each second bit line, the second dummy word line and the common cell plate voltage line, and wherein second dummy data having opposite polarity to polarity of first data are written in the second dummy memory cell so as to write the first data in the first memory cell, and first dummy data having opposite polarity to polarity of second data are written in the first dummy memory cell so as to write the second data in the second memory cell.

According to a second aspect of the invention, in the memory array according to the first aspect of the invention, the timing at which the first and second dummy word lines change from an active state to an inactive state is delayed by a predetermined time with respect to the timing at which the first and second word lines change from an active state to an inactive state.

According to a third aspect of the invention, the memory array according to the first aspect of the invention further comprises means for applying a precharge voltage to a midpoint of a connection between a switching transistor and a capacitor of each of the first and second dummy memory cells when the first and second word lines and the first and second dummy word lines change from an active state to an inactive state.

According to a fourth aspect of the invention, the memory array according to the first, second or third aspect of the invention is made of a dynamic RAM.

BRIEF DESCRIPTION OF THE DRAWINGS

FIG. 6, consisting of FIGS. 6A to 6D, is a timing chart to be used for explaining the operation of the memory array shown in FIG. 5.

BEST MODE FOR CARRYING OUT THE INVENTION

Figure 1:
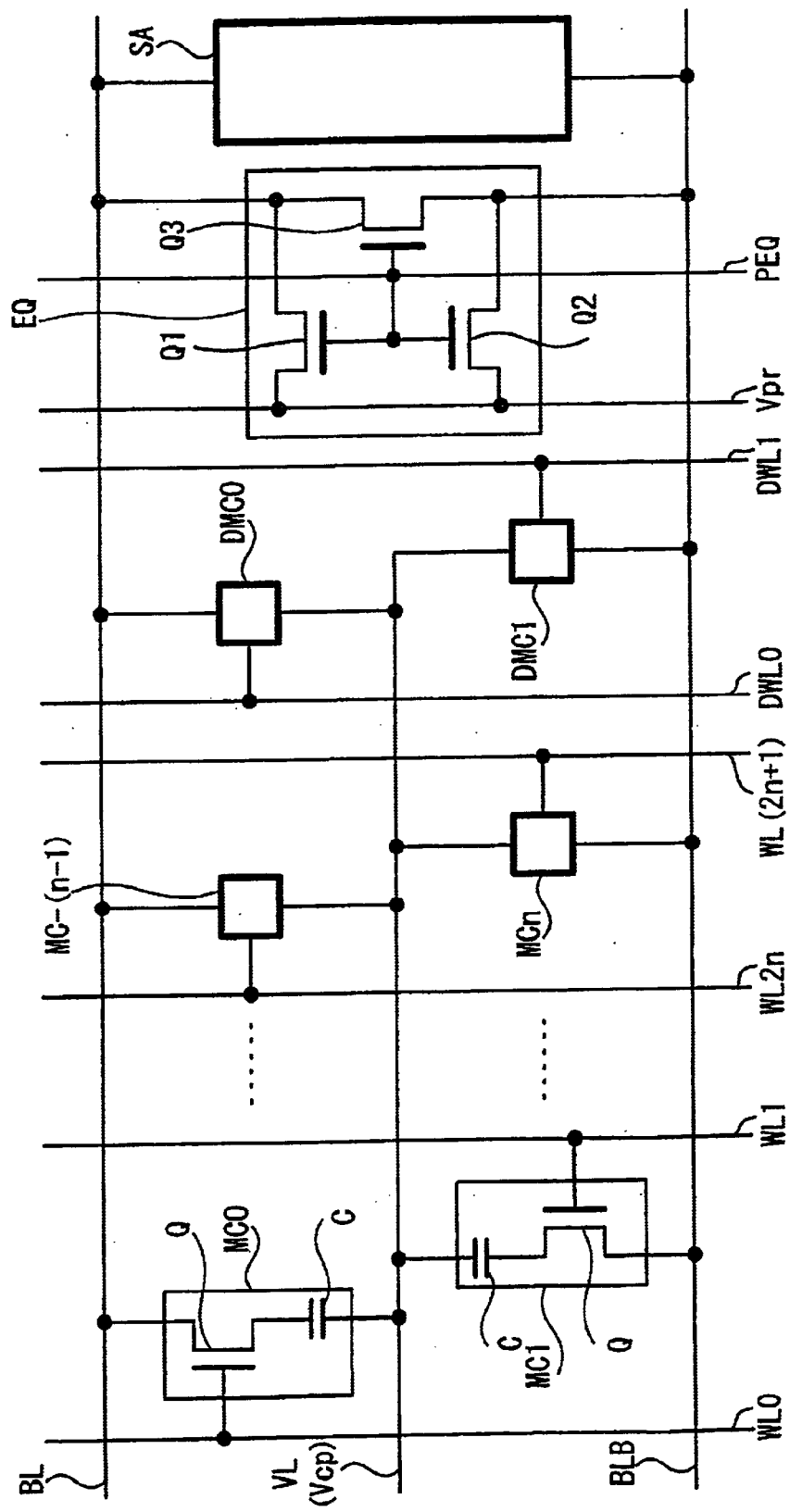
FIG. 1 is a circuit diagram showing a memory array according to an embodiment of the invention.
Figure 5:
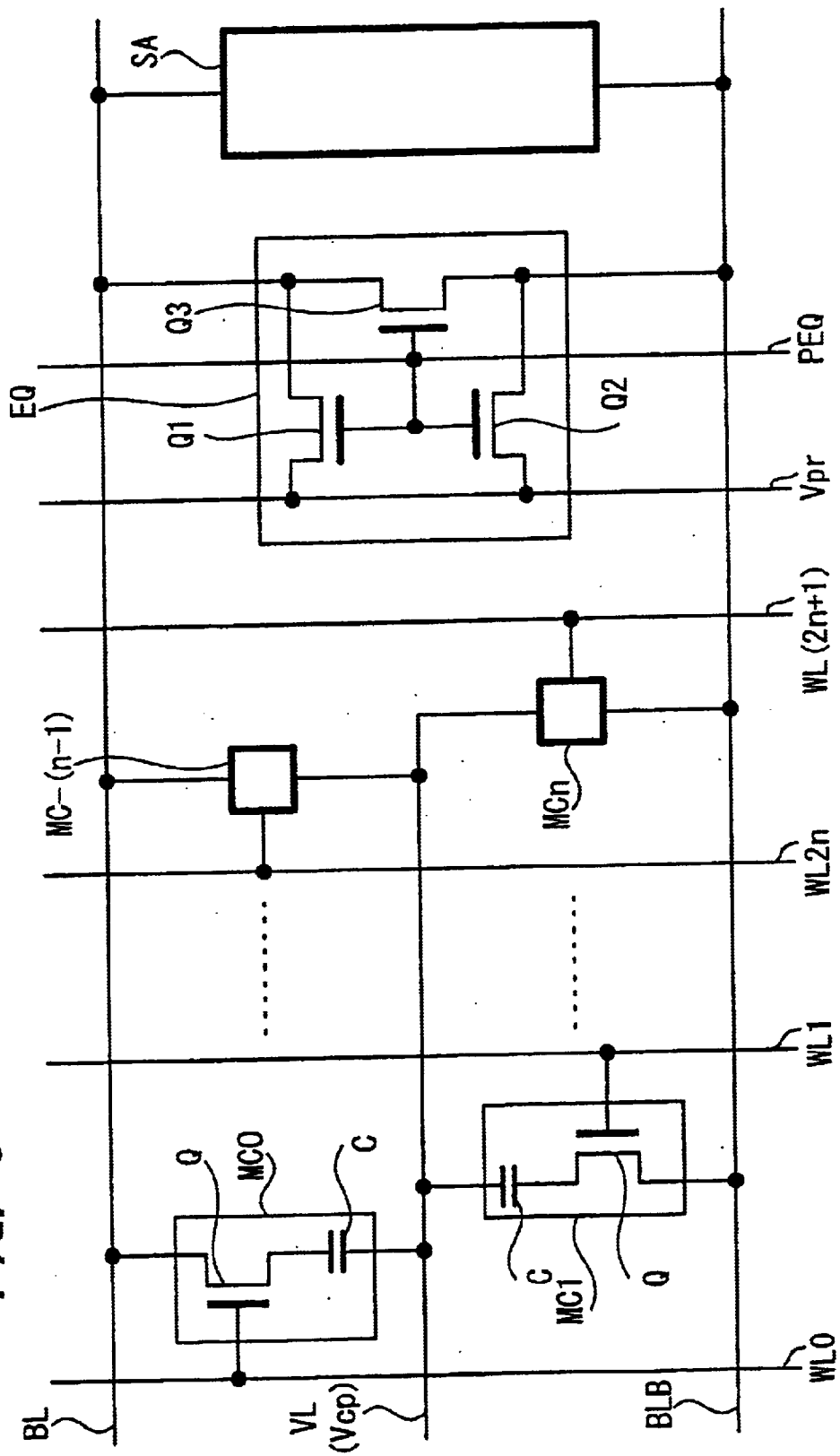
FIG. 5 is a circuit diagram showing a memory array of the prior art.

A memory array according to an embodiment of the invention will be described below with reference to FIG. 1. In FIG. 1, parts corresponding to parts shown in FIG. 5 are designated by the same reference characters. MC0, MC1, . . . , MC(n−1), and MCn denote memory cells, each of which comprises a switching transistor Q (a MOSFET) and a capacitor C which are connected in series. WL0, WL1, . . . , WL2n, and WL(2n+1) denote word lines for activating the memory cells MC0, MC1, . . . , MC(n−1), and MCn, respectively. BL and BLB denote a pair of bit lines whose complementary logic voltages are interchanged during the data writing. VL denotes a cell plate voltage line for applying a cell plate voltage Vcp (=Vcc/2) to the capacitors C of the memory cells MC0, MC1, . . . , MC(n−1), and MCn.

Each series circuit comprising the switching transistor Q (the MOSFET) and the capacitor C of each of the memory cells MC0, MC2, . . . , and MC(n−1) is connected between the bit line BL and the cell plate voltage line VL. The respective control terminals (i.e., gates) of the switching transistors Q of the memory cells MC0, MC2, . . . , and MC(n−1) are connected to the word lines WL0, WL2, . . . , and WL2n, respectively. In this case, the capacitors C sides are connected to the cell plate voltage line VL.

Each series circuit comprising the switching transistor Q and the capacitor C of each of the memory cells MC1, MC3, . . . , and MCn is connected between the bit line BLB and the cell plate voltage line VL. The respective control terminals (i.e., gates) of the switching transistors Q are connected to the word lines WL1, WL3, . . . , and WL(2n+1), respectively. In this case, the capacitors C sides are connected to the cell plate voltage line VL.

Furthermore, a sense amplifier SA is connected between the bit lines BL and BLB. An equalizer circuit EQ is also connected between the bit lines BL and BLB. The equalizer circuit EQ comprises MOSFETs Q1, Q2 and Q3. A bit line precharge voltage Vpr (=Vcc/2) is applied to the respective drains of the MOSFETs Q1 and Q2, and the respective sources of the MOSFETs Q1 and Q2 are connected to the bit lines BL and BLB, respectively. A drain and a source of the MOSFET Q3 are connected to the bit lines BL and BLB, respectively. The bit line precharge voltage Vpr is supplied to the bit lines BL and BLB, and a gate signal PEQ for equalizing the bit lines BL and BLB is applied to the respective gates of the MOSFETs Q1, Q2 and Q3.

Dummy memory cells DMC0 and DMC1, which have the same configurations as the memory cells MC0 and MC1, respectively, are provided. A series circuit comprising a switching transistor Q (a MOSFET) and a capacitor C of the dummy memory cell DMC0 is connected between the bit line BL and the cell plate voltage line VL. A control terminal (i.e., a gate) of the switching transistor Q of the dummy memory cell DMC0 is connected to a dummy word line DWL0 for activating the dummy memory cell DMC0. In this case, the capacitor C is connected to the cell plate voltage line VL. A series circuit comprising a switching transistor Q and a capacitor C of the dummy memory cell DMC1 is connected between the bit line BLB and the cell plate voltage line VL. A control terminal (i.e., a gate) of the switching transistor Q of the dummy memory cell DMC1 is connected to a dummy word line DWL1 for activating the dummy memory cell DMC1. In this case, the capacitor C sides are connected to the cell plate voltage line VL.

Next, the operation of the memory array shown in FIG. 1 will be described with reference to FIG. 2. When a voltage of the word line WL0 changes to high level as shown in FIG. 2A and thus the memory cell MC0 is activated and more specifically the MOSFET Q of the memory cell MC0 is turned on, a read operation and a write operation are performed as discussed below. Data "0" stored in the capacitor C of the memory cell MC0 is supplied to the sense amplifier SA through the MOSFET Q and the bit line BL and is then amplified and latched by the sense amplifier SA, and thus a voltage of the bit line BL changes to 0 (V) as shown in FIG. 2C. After that, data "1" is inversely written in the sense amplifier SA and is then amplified and latched by the sense amplifier SA, and thus the voltage of the bit line BL is inverted into Vcc (V) as shown in FIG. 2C. Thus, the data "1" is rewritten in the capacitor C of the memory cell MC0 through the bit line BL and the MOSFET Q of the memory cell MC0.

After the end of rewriting, the voltage of the word line WL0 changes from high level to low level as shown in FIG. 2A, and simultaneously, the gate signal PEQ changes from low level to high level as shown in FIG. 2E. Thus, the MOSFETs Q1 to Q3 constituting the equalizer circuit EQ are switched from the off state to the on state, and thus, both the voltages of the bit lines BL and BLB are equalized and precharged at the bit line precharge voltage Vpr(=Vcc/2) as shown in FIG. 2C.

Incidentally, when the word line WL0 has a high voltage, a voltage of the dummy word line DWL1 connected to the gate of the MOSFET Q of the dummy memory cell DMC1 is also high as shown in FIG. 2B, and thus the MOSFET Q of the dummy memory cell DMC1 is on.

Switching from reading to writing causes a change in the voltage of the bit line BL from 0 (V) to Vcc (V) as shown in FIG. 2C, and thus, coupling noise is superimposed on the cell plate voltage Vcp through the capacitor C of the memory cell MC0. On the other hand, switching from reading to writing causes a change in a voltage of the bit line BLB from Vcc (V) to 0 (V) as shown in FIG. 2C, and thus, coupling noise is superimposed on the cell plate voltage Vcp through the capacitor C of the dummy memory cell DMC1. In this case, these coupling noises are identical in level (i.e., magnitude) and are opposite in polarity, and thus the coupling noises are canceled. Therefore, the coupling noises are not superimposed on the cell plate voltage Vcp.

In this case, when the voltage of the dummy word line DWL1 is changed from high level to low level simultaneously with the voltage of the word line WL0, data having the opposite polarity to the polarity of data to be rewritten in the memory cell MC0 is written in the dummy memory cell DMC1. Therefore, when a voltage of another word line is next changed from low level to high level, data having the same polarity as the polarity of data stored in the dummy memory cell DMC1 is read out through the bit line BL. This eliminates a slight potential difference between the bit lines BL and BLB and may thus lead to an erroneous reading of data.

As shown in FIGS. 2A and 2B, the voltage of the dummy word line DWL1 is changed from high level to low level later than the voltage of the word line WL0, whereby data having the opposite polarity to the polarity of data to be rewritten in the memory cell MC0 can be prevented from being written in the dummy memory cell DMC1.

Generally speaking, when the voltages of the word lines WL0, WL2, ..., and WL2n are changed from low level to high level and activated, the voltage of the dummy word line DWL1 can be changed from low level to high level and activated. On the other hand, when the voltages of the word lines WL1, WL3, and WL(2n+1) are changed from low level to high level and activated, the voltage of the dummy word line DWL0 can be changed from low level to high level and activated.

Incidentally, when the voltage of the word line WL0 changes to high level as shown in FIG. 2A, the voltage of the word line WL1 also changes to high level, and thus the voltage of the bit line BL becomes reverse of the voltage of the bit line BLB as shown in FIG. 2C in a condition in which data is latched by the sense amplifier SA during reading and writing.

Switching from reading to writing causes a change in the voltage of the bit line BLB from Vcc (V) to 0 (V) as shown in FIG. 2C, and thus, coupling noise is superimposed on the cell plate voltage Vcp through the capacitor C of the memory cell MC1. On the other hand, switching from reading to writing causes a change in the voltage of the bit line BL from 0 (V) to Vcc (V) as shown in FIG. 2C, and thus, coupling noise is superimposed on the cell plate voltage Vcp through the capacitor C of the dummy memory cell DMC0. In this case, these coupling noises are identical in level (i.e., same magnitude) and are opposite in polarity, and thus the coupling noises are canceled. Therefore, the coupling noises are not superimposed on the cell plate voltage Vcp.

Figure 3:
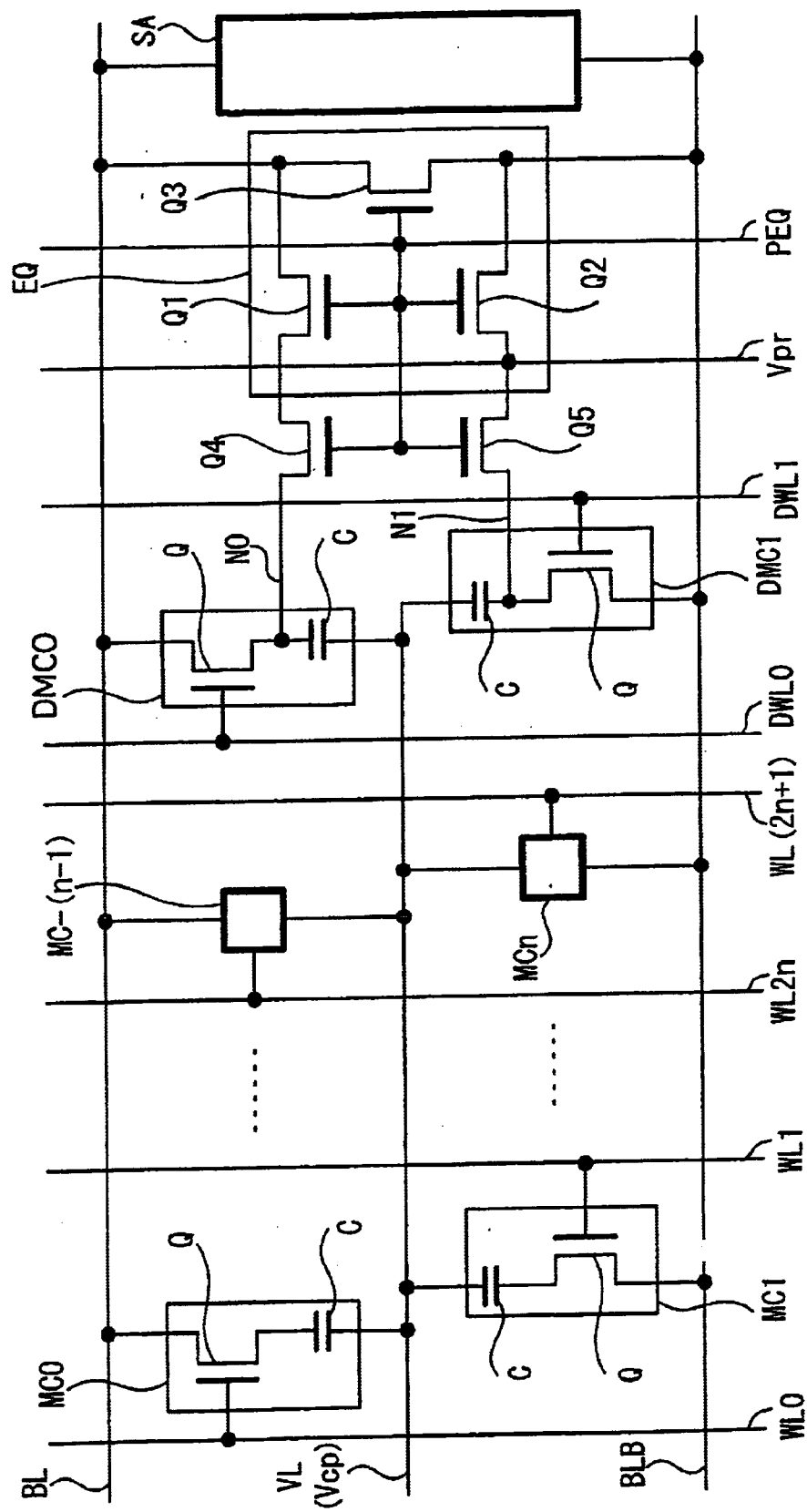
FIG. 3 is a circuit diagram showing another example of a memory array according to the embodiment of the invention.

Next, an another example of a memory array according to the embodiment of the invention will be described. In FIG. 3, parts corresponding to parts shown in FIG. 1 are designated by the same reference characters so as to avoid repeated descriptions. The description is given with regard to different parts in FIG. 3 from the parts shown in FIG. 1. N0, N1 denote nodes arranged between the MOSFET Q and the capacitor C of the dummy memory cell DMC0, DMC1. There are provided MOSFETs Q4 and Q5, each of which functions as a switching transistor. The respective drains of the transistors Q4 and Q5 are connected to the nodes N0 and N1, respectively. The bit line precharge voltage Vpr (=Vcc/2) is applied to the respective sources of the transistors Q4 and Q5. The gate signal PEQ for equalizing the bit lines BL and BLB is supplied to the respective gates thereof.

The memory array having the above-mentioned configuration operates in the following manner. For example, when the voltage of the word line WL0 changes from high level to low level as shown in FIG. 4A, the gate signal PEQ changes from low level to high level as shown in FIG. 4F. Thus, the MOSFETs Q1 to Q3 constituting the equalizer circuit EQ are switched from the off to the on, and thus, both the voltages of the bit lines BL and BLB are equalized and precharged at the bit line precharge voltage Vpr(=Vcc/2) as shown in FIG. 4C. At the same time, the MOSFETs Q4 and Q5 are turned on, and thus the bit line precharge voltage Vpr (=Vcc/2) is applied to the nodes N0 and N1 of the dummy memory cells DMC0 and DMC1. Accordingly, as shown in FIGS. 4A and 4B, the voltage of the dummy word line DWL1 can be changed from high level to low level simultaneously with the voltage of the word line WL0. As shown in FIGS. 4A and 4B, the voltage of the dummy word line DWL0 can be also changed from high level to low level simultaneously with the voltage of the word line WL1.

FIG. 4E shows a change in a voltage of the node N1. A voltage of the capacitor C of the dummy memory cell DMC1 changes in the following order: Vcc (V) (during reading)→0 (V) (during writing)→Vpr((=Vcc/2) (during equalization and precharge).

Figure 2:
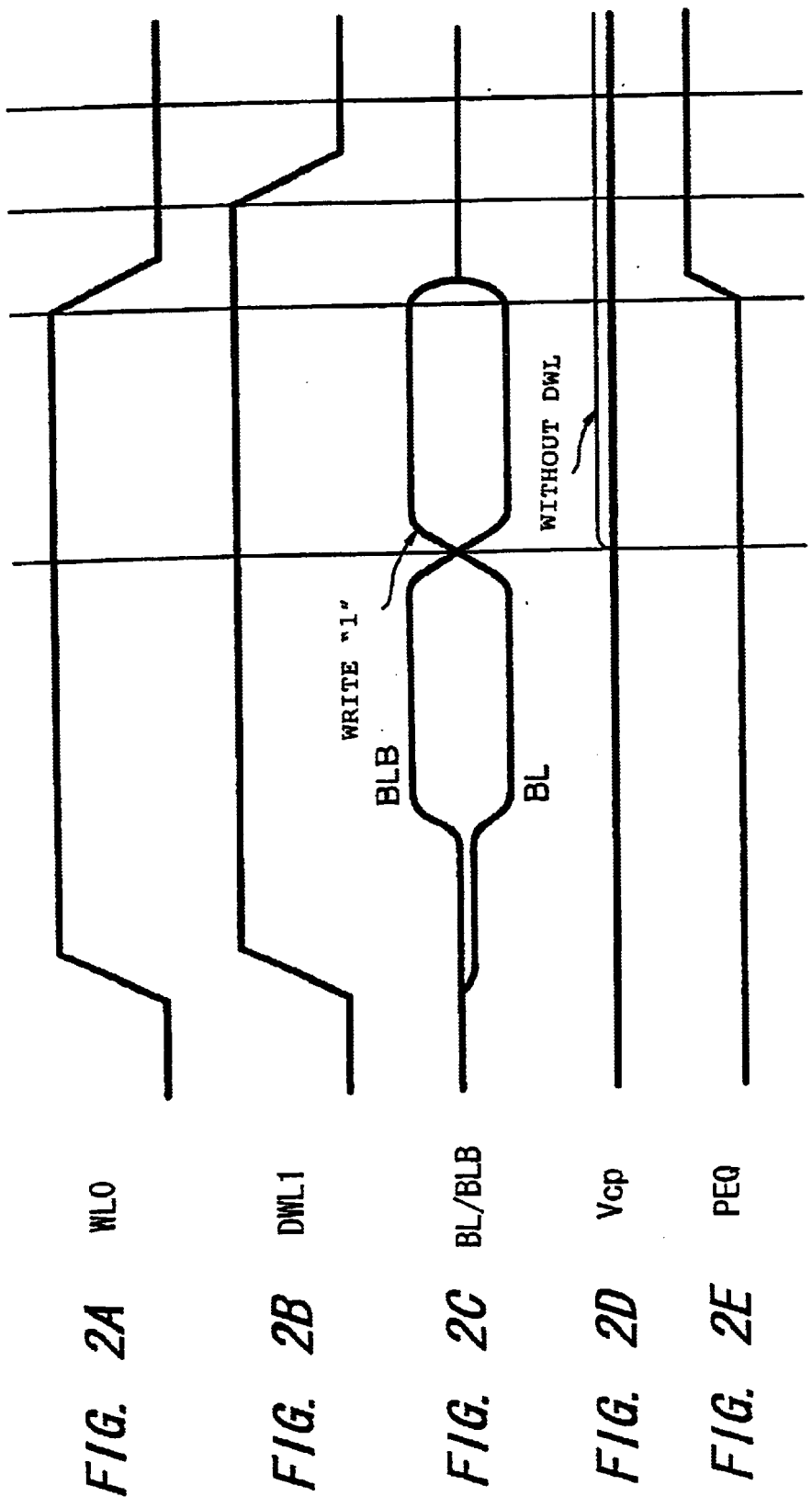
FIG. 2, consisting of FIGS. 2A to 2E, is a timing chart to be used for explaining the operation of the memory array shown in FIG. 1.
Figure 4:
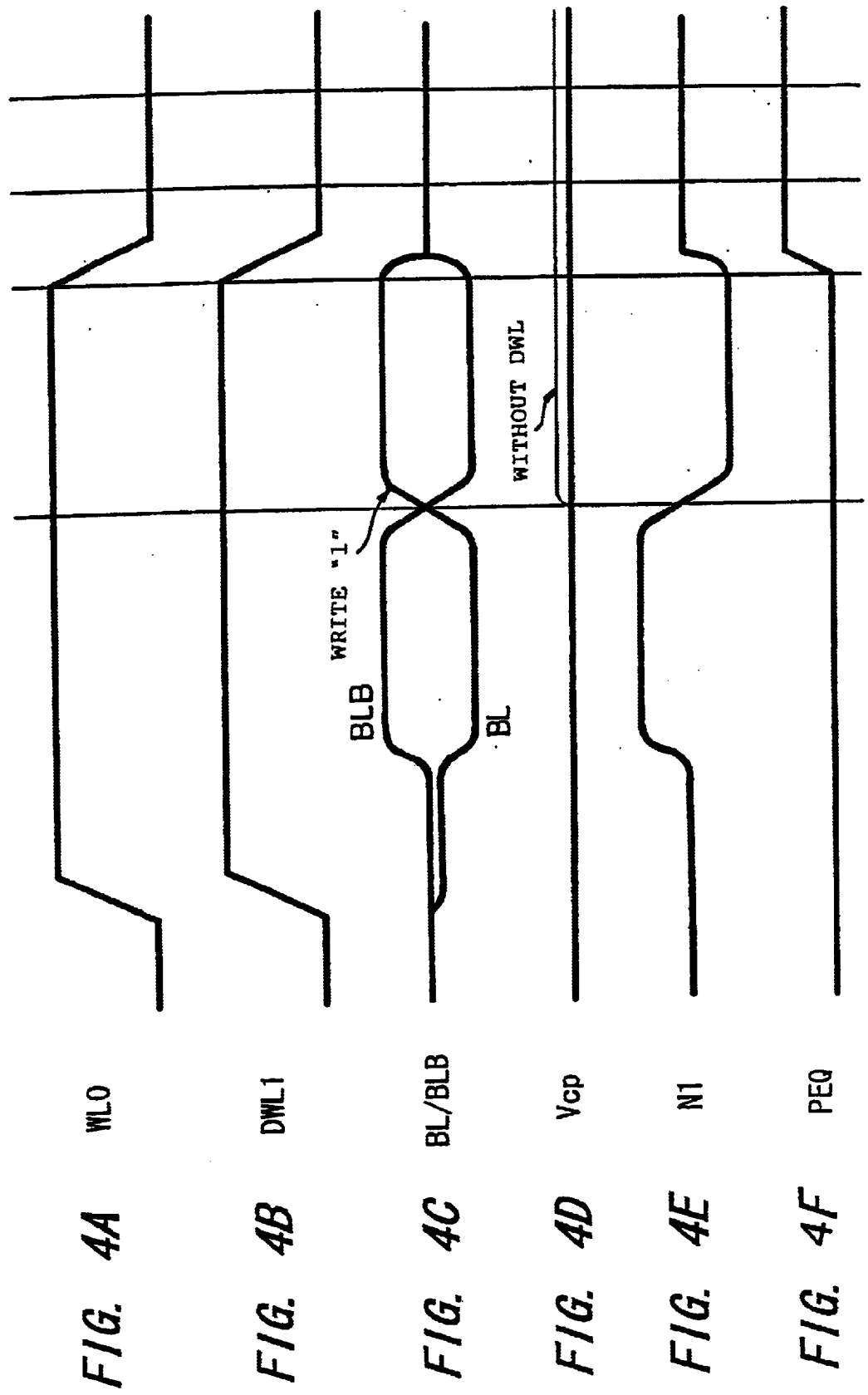
FIG. 4, consisting of FIGS. 4A to 4F, is a timing chart to be used for explaining the operation of the memory array shown in FIG. 3.

In the memory arrays shown in FIGS. 1 and 3, the timing of activation at which the voltage of the word line WL0 changes from low level to high level is the same as the timing of activation at which the voltage of the dummy word line DWL1changes from low level to high level, as shown in FIG. 2 and FIG. 4. However, the timing of activation of the dummy word line DWL1 can be delayed with respect to the timing of activation of the word line WL0 in order to minimize an influence upon the slight potential difference between the bit lines.

According to a first aspect of the invention, there is provided a memory array including a plurality of pairs of first and second bit lines whose complementary logic voltages are interchanged during data writing; a plurality of pairs of first and second word lines; a common cell plate voltage line; a first memory cell connected to each first bit line, each first word line and the common cell plate voltage line; a second memory cell connected to each second bit line, each second word line and the common cell plate voltage line; and a sense amplifier connected between the first and second bit lines of each pair, wherein a plurality of the first and second memory cells are arranged in a matrix form, the memory array comprising: first and second dummy word lines; a first dummy memory cell connected to each first bit line, the first dummy word line and the common cell plate voltage line; and a second dummy memory cell connected to each second bit line, the second dummy word line and the common cell plate voltage line, wherein second dummy data having opposite polarity to polarity of first data are written in the second dummy memory cell so as to write the first data in the first memory cell, and first dummy data having opposite polarity to polarity of second data are written in the first dummy memory cell so as to write the second data in the second memory cell. Therefore, it is possible to prevent coupling noise from being produced on the cell plate voltage line, regardless of an increase in the capacitor, an increase in the number of bits, an increase in speed, or the like. Moreover, it is possible to achieve a memory array which does not cause an increase in power consumption, because the function of a cell plate voltage generator is not used as means for preventing coupling noise from being produced.

According to a second aspect of the invention, in the memory array according to the first aspect of the invention, the timing at which the first and second dummy word lines change from an active state to an inactive state is delayed with respect to the timing at which the first and second word lines change from an active state to an inactive state, by a predetermined time. Therefore, it is possible not only to achieve the same advantages as the advantages of the memory array according to the first aspect of the invention, but also to achieve a memory array which can prevent unnecessary data from being written in the first and second dummy memory cells when avoiding coupling noise from being produced on the cell plate voltage line.

According to a third aspect of the invention, the memory array according to the first aspect of the invention further comprises means for applying a precharge voltage to a midpoint of a connection between a switching transistor and a capacitor of each of the first and second dummy memory cells when the first and second word lines and the first and second dummy word lines change from an active state to an inactive state. Therefore, it is possible not only to achieve the same advantages as the first aspect of the first invention, but also to achieve a memory array which can prevent unnecessary data from being written in the first and second dummy memory cells when avoiding coupling noise from being produced on the cell plate voltage line.

The memory array according to the first, second or third aspect of the invention may be realized using a dynamic RAM.

I claim:

1. A memory array including a plurality of pairs of first and second bit lines whose complementary logic voltages are interchanged during data writing; a plurality of pairs of first and second word lines; a common cell plate voltage line; a first memory cell connected to said first bit line, said first word line and said common cell plate voltage line; a second memory cell connected to said second bit line, said second word line and said common cell plate voltage line; and a sense amplifier connected between said first and second bit lines, wherein a plurality of said first and second memory cells are arranged in a matrix form, the memory array comprising:

first and second dummy word lines;

a first dummy memory cell connected to said first bit line, said first dummy word line and said common cell plate voltage line; and a second dummy memory cell connected to said second bit line, said second dummy word line and said common cell plate voltage line, wherein second dummy data having opposite polarity to polarity of first data are written in said second dummy memory cell so as to write the first data in said first memory cell, and first dummy data having opposite polarity to polarity of second data are written in said first dummy memory cell so as to write the second data in said second memory cell, thereby canceling coupling noise on said common cell plate voltage line.

2. The memory array according to claim 1, wherein the timing at which said first and second dummy word lines changes from an active state to an inactive state is delayed with respect to the timing at which said first and second word lines changes from an active state to an inactive state, by a predetermined time.

3. The memory array according to claim 1 further comprising means for applying a precharge voltage to a midpoint of a connection between a switching transistor and a capacitor of each of said first and second dummy memory cells when said first and second word lines and said first and second dummy word lines change from an active state to an inactive state.

4. The memory array according to claim 1, wherein said memory array is realized using a dynamic RAM.

5. The memory array according to claim 2, wherein said memory array is realized using a dynamic RAM.

6. The memory array according to claim 3, wherein said memory array is realized using a dynamic RAM.

* * * * *